United States Patent [19]
Schuhl et al.

[11] Patent Number: 5,313,186
[45] Date of Patent: May 17, 1994

[54] SENSOR OF WEAK MAGNETIC FIELDS, WITH MAGNETORESISTIVE EFFECT

[75] Inventors: Alain Schuhl, Clamart; Stephane Tyc, Paris, both of France

[73] Assignee: Thomson-CSF, Puteaux, France

[21] Appl. No.: 991,589

[22] Filed: Dec. 16, 1992

[30] Foreign Application Priority Data

Dec. 23, 1991 [FR] France .................. 91 16042

[51] Int. Cl.$^5$ .............. H01L 43/00; G01R 33/02
[52] U.S. Cl. ................... 338/32 R; 324/252
[58] Field of Search ............... 338/32 R, 32 H; 360/113; 324/252

[56] References Cited

U.S. PATENT DOCUMENTS 5,206,590  4/1993  Dieny et al. .................. 324/252

FOREIGN PATENT DOCUMENTS 485129  5/1992  European Pat. Off. .

OTHER PUBLICATIONS

Stearns, et al., Journal of Applied Physics, vol. 67, No. 9, May 1990, pp. 5925-5930. "Antiferromagnetic coupling between layers in Co/Cr multilayer (invited)".

Binasch, et al., Physical Review B: Condensed Matter, vol. 39, No. 7, Mar. 1989, pp. 4828-4830. "Enhanced magnetoresistance in layered magnetic structures with antiferromagnetic interlayer exchange".

Brubaker, et al., Applied Physics Letters, vol. 58, No. 20, May 1991, pp. 2306-2308. "Oscillatory interlayer magnetic coupling of sputtered Fe/Mo superlattices".

*Primary Examiner*—Marvin M. Lateef
*Attorney, Agent, or Firm*—Oblon, Spivak, McClelland, Maier & Neustadt

[57] ABSTRACT

A sensor of weak magnetic fields with magnetoresistive effect features a metallic multilayer formed by alternating magnetic and non-magnetic metals. In order to detect weak fields, a sensor is described wherein a magnetic field is coupled by an anti-ferromagnetic type coupling with a first neighboring magnetic layer and by a ferromagnetic type coupling with a third neighboring magnetic layer, so that there is frustration of coupling. The first and third magnetic layers are blocked by their strong coercive field. The sensor finds particular application to detection on magnetic media.

4 Claims, 1 Drawing Sheet

SENSOR OF WEAK MAGNETIC FIELDS, WITH MAGNETORESISTIVE EFFECT

BACKGROUND OF THE INVENTION

1. Field of the Invention

The present invention relates to a sensor of weak magnetic fields, with magnetoresistive effect, and more specifically to the structure of the layers of materials that constitute such a sensor.

The term "sensor with magnetoresistive effect" is used to designate a sensor using the variation of resistivity of at least one material that forms it as a function of the variation of a magnetic field. A weak magnetic field is the field radiated by the tape of a magnetic recording for example.

2. Description of the Prior Art

Various types of sensors with magnetoresistive effect are known and are implemented in systems for the reading of magnetic recordings such as tapes, drums and diskettes. These sensors comprise a monolithic part, a block made of a ferromagnetic alloy with high magnetoresistance, which is placed in the magnetic circuit of a reading head which reproduces the variations of the electrical resistance of the magnetoresistive sensor while a recording flows past. The alloys most frequently used, at present, are nickel-based ferromagnetic alloys such as NiCo, NiFe (Permalloy) which have high magnetoresistance but which, at ambient temperature, give a relative variation in resistance of only a few percent.

Sensors of greater sensitivity have been developed more recently: they use a phenomenon known as "giant magnetoresistance" which develops when the sensitive element of the sensor is constituted by a multilayer of alternating magnetic and non-magnetic metals. In this multilayer, the magnetic layers have ferromagnetic (parallel) type coupling, outside any magnetic field, or anti-ferromagnetic (anti-parallel) type coupling under a magnetic field, and the transition from one state to the other occurs on a small interval of a field. The drawback of these multilayer sensors is the excessive value of the magnetic field needed for the "reversal" to make the magnetizations of the layers transit from the parallel state to the anti-parallel state. A strong magnetic field is needed when the layers have regular thicknesses and are coupled to one another. The energy of the "reversal" is equal to the sum of the energies used for the coupling of one layer with the two adjacent layers.

SUMMARY OF THE INVENTION

The invention proposes a sensor of weak magnetic fields with magnetoresistive effect and a multilayer structure wherein the energy of reversal is low and is suitable for the measurement of a weak magnetic field. A sensor according to the invention has at least one cell in which two layers of non-magnetic materials alternative regularly with three layers of magnetic materials. The thicknesses of the two non-magnetic materials are different and are such that the central magnetic layer is coupled antiferromagnetically with a first neighboring magnetic layer and ferromagnetically with a second neighboring magnetic layer: irrespectively of the orientation of the magnetization of the central layer, one of the two couplings is frustrated, i.e. it does not correspond to what it ought to be when there are no other magnetic interactions and couplings.

More specifically, the invention relates to a sensor of weak magnetic fields with magnetoresistive effect, comprising a metallic multilayer formed by at least three layers of magnetic materials alternating with two layers of non-magnetic materials, wherein the coupling of the second magnetic layer, which is the central layer in the multilayer, is an anti-ferromagnetic type coupling with the first magnetic layer and a ferromagnetic type coupling with the third magnetic layer, causing a phenomenon of frustration of the couplings, whatever may be the magnetic field measured by this sensor.

BRIEF DESCRIPTION OF THE DRAWING

The invention will be understood more clearly from the following description of an exemplary embodiment, made with reference to the appended figures, of which.

MORE DETAILED DESCRIPTION

Figure 1:
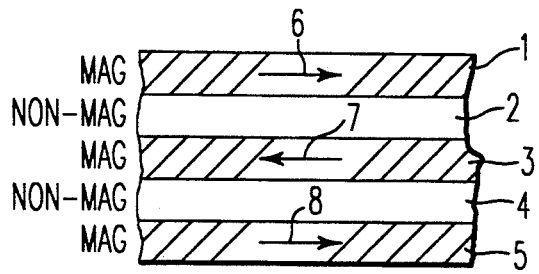
FIGS. 1 and 2 show a multilayer structure with giant magnetoresistance, showing the anti-ferromagnetic (FIG. 1) and ferromagnetic (FIG. 2) types of coupling.

FIG. 1 shows a fraction of a multilayer structure with giant magnetoresistance: this structure is known per se but constitutes the basis of the sensor according to the invention. On a rigid substrate (not shown), there is formed, by cathode spraying for example, a monocrystalline multilayer structure obtained by the stacking of layers of a magnetic material 1, 3, 5 alternating with layers of a non-magnetic material 2, 4.

The most frequently used non-magnetic materials are Cu, Ag, Au, Mn, Cr, Va and Ti. The magnetic materials are above all Fe, Ni, Co and the most common pairs are Fe/Cr, Co/Au, Fe/Cu although pairs of rare earths, such as Gd/Y, Gd/Dy, Dy/Y, Y/Er etc, are also referred to in the literature on the subect.

The thicknesses of the layers 1 to 5 are regular (barring unevennesses related to the precision of deposition) and are in a range of about 5 angstroms to 100 angstroms such that, when there is no magnetic field,, the layers of magnetic material 1, 3, 5 have an anti-ferromagnetic type of coupling. This type of coupling is illustrated in FIG. 1 by the three symbolic arrows 6, 7, 8: when there is no external magnetic field, if the magnetization of the magnetic layer 1 is, for example, directed rightwards in the figure (arrow 6), then the magnetization of the neighboring layer 3 (the non-magnetic layer 2 being not magnetized) is directed leftwards (arrow 7) and is hence anti-parallel, and the magnetization of the magnetic layer 5 is again directed rightwards (arrow 8), and is hence again anti-parallel with respect to the previous layer. The states of magnetization in the magnetic layers 1, 3, 5, when there is no field, are in an anti-parallel arrangement.

Figure 2:
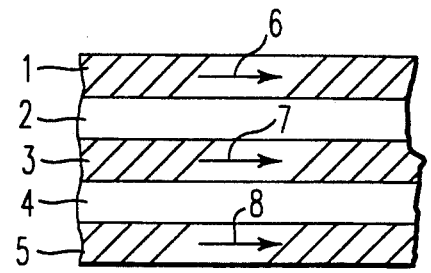

Under the effect of a magnetic field parallel to the magnetic layers 1, 3, 5, the state of anti-parallel arrangement (anti-ferromagnetic coupling) of FIG. 1 changes into the state of parallel arrangement (ferromagnetic coupling) illustrated in FIG. 2 wherein the magnetization states all have the same orientation. The transition from a state of anti-parallel arrangement to a state of parallel arrangement takes place in a small interval of a magnetic field.

The electrical resistance of a multilayer structure varies according to the state of arrangement. The electrons that convey the current have a spin which may have two values, $+\frac{1}{2}$ or $-\frac{1}{2}$, and which correspond to the direction of rotation of an electron about its axis. To simplify the explanations, let these two types of electrons be designated as "high" electrons and "low" electrons. In a multilayer in an anti-parallel state (FIG. 1), the "high" electrons get diffused at the interfaces with the layers that have a "high" magnetization state (arrows 6, 8) and the "low" electrons get diffused at the interfaces with the layers that have a "low" magnetization state (arrow 7): the magnetic layers 1, 3, 5 all have the same "high" value resistance to the passage of the current, and the resistance of the multilayer is high. By contrast, in a multilayer in a parallel state (FIG. 2), the "high" electrons get diffused on the "high" layers but the "low" electrons do not get diffused on any layer (or vice versa). Consequently, the "low" electrons bring low resistance to the multilayer. This is the magnetoresistance which is called "giant magnetoresistance" only in certain specific features of the multilayer structure and the nature of materials such that the variation of resistance under the variation of the magnetic field, in a restricted field, can be used for the purposes of a sensor with magnetoresistive effect.

Figure 3:
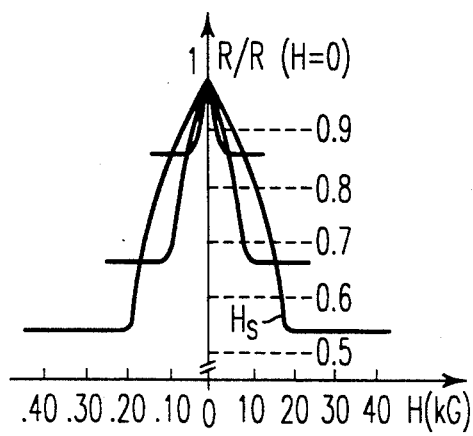
FIG. 3 is a curve showing the variation of the magnetoresistance as a function of the magnetic field.

FIG. 3 shows the variation of the ratio between resistance under a field and resistance outside any field, $R/R_{H=0}$, as a function of the magnetic field, for three structures of Fe/Cr multilayers having different thicknesses of chrome. It is seen that, in this system, the magnetoresistance $R/R_{H=0}$ may vary in a ratio of about 1 to 0.5 but that, by contrast, this variation is obtained at the cost of a strong magnetic field of reversal, of 20 kgauss in this example.

This is the main drawback of these sensors: the excessively high value of the magnetic field of saturation $H_s$ needed to obtain the parallel/anti-parallel reversal makes the advantage constituted by the giant magnetoresistance a relative one. To reduce $H_s$, it is possible to reduce the force of the coupling by increasing the distance between the layers, but magnetoresistance gets reduced very swiftly for the volume of the electrically conductive metal is increased without an increase in the number of interfaces in which the electrons are diffused.

An aim of the invention is a magnetoresistive sensor working with a very weak magnetic field which uses a particular property of certain metallic multilayers, namely the frustration of the magnetic couplings between layers. This makes it possible to reduce the fields of saturation $H_s$ of these sensors.

It is a matter of very recent knowledge that the magnetoresistance of a metallic multilayer structure undergoes a phenomenon of oscillation as a function of the thickness of layers of non-magnetic material, at least for certain pairs of materials. More specifically, the nature of the coupling, whether ferromagnetic or anti-ferromagnetic, between the successive magnetic layers depends on the thickness of the non-magnetic material between them.

Figure 4:
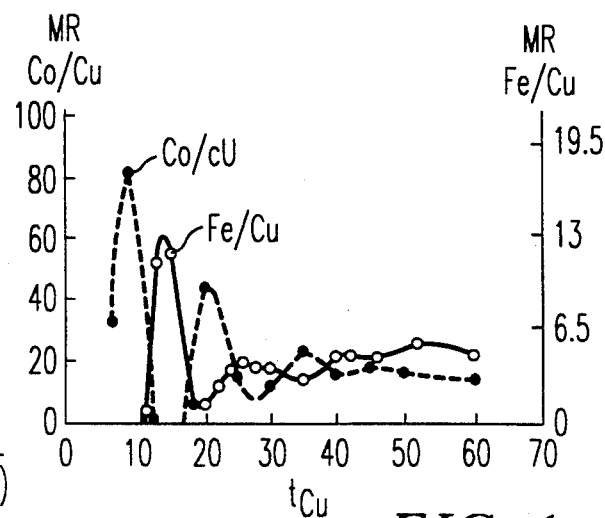
FIG. 4 is a curve showing the variation of the magnetoresistance as a function of the thickness of non-magnetic materials.

FIG. 4 illustrates two examples of this type of oscillation of the magnetoresistance MR for two systems of materials Co/Cu and Fe/Cu as a function of the thickness $t_{Cu}$ of the copper layers, expressed in angstroms, said layers having a regular thickness in the multilayer.

The magnetizations are placed in an anti-parallel configuration (anti-ferromagnetic coupling) with very small thicknesses of copper (below 10 Å for Co/Cu and 15 Å for Fe/Cu), and then take a parallel configuration (ferromagnetic coupling) when the thickness of the copper increases. By further increasing the thickness of copper (to more than 15 Å and 20 Å respectively), the system returns to an anti-parallel configuration and the process continues in this way.

Figure 5:
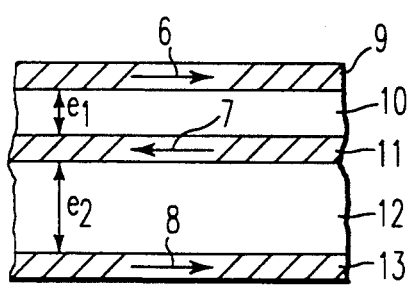
FIGS. 5 and 6 show two multilayer structures with magnetostrictive effect according to the invention, in the form of an elementary cell (FIG. 5) and of a system of elementary cells (FIG. 6).

This phenomenon of oscillation in the nature of the magnetic coupling between layers is used in the sensor of the invention to reduce the anchoring between magnetic layers without reducing the magnetoresistance. FIG. 5 shows an elementary cell of this magnetoresistive sensor.

In common with the structure of FIG. 1, the structure of this cell has the quality of being a metal multilayer formed by three magnetic layers 9, 11 and 13 alternating with two magnetic layers 10 and 12. The substrate that supports this multilayer has not been shown. Nor is it shown in the next figure. The preferred magnetic materials (9, 11, 13) are iron, cobalt, nickel and the preferred non-magnetic materials (10, 12) are copper, silver, gold, manganese, chrome, vanadium or titanium.

A first characteristic of the sensor according to the invention lies in the arrangement of the interactions that couple the various magnetic layers: a coupling frustration is created to reduce the saturation fields and, consequently, the reversal energies. To do this, the thickness e1 of a first layer of non-magnetic material, for example the layer 10, is determined so that the second magnetic layer, the central layer, of the cell, namely the layer 11, has an anti-ferromagnetic coupling with the first magnetic layer 9. Simultaneously, the thickness $e_2$ of the second layer of non-magnetic material, $e_2$ in this case, is determined so that the same second magnetic layer 11 has a ferromagnetic coupling with the third magnetic layer 13, this coupling being slightly weaker than the previous anti-ferromagnetic coupling. But furthermore, the materials of the first and third magnetic layers 9 and 13 are chosen for their strong coercive field, so that the magnetizations (arrows 6 and 8) of these two layers are blocked in a ferromagnetic configuration. Thus, since the magnetizations of the layers 9 and 13 are blocked, and since the nature of the couplings between the three magnetic layers are controlled by the thicknesses $e_1$ and $e_2$ of the two non-magnetic layers, one of the two couplings is always frustrated, irrespectively of the orientation of the magnetization.

In the case being explained, the frustration relates to the coupling 11-13 because it has been chosen so as to be slightly weaker than the coupling 9-11, but the choice of the thicknesses $e_1$ and $e_2$ and of the materials can result in an opposite situation.

A second characteristic of the sensor according to the invention relates to the choice of the magnetic materials. A system such as Fe/Cu in which a first magnetic material is regularly alternated with a second non-magnetic material belonging to the field of the invention if it corresponds to the thicknesses $e_1$ $e_2$ which entail a frustration for one of the two couplings between magnetic layers 9/11 and 13/11.

However, according to the invention, it is preferable to choose two different magnetic materials. In an elementary cell such as in FIG. 5:
the first and third magnetic layers 9 and 13 are made of "hard" magnetic materials, i.e. materials with strong coercive fields. In the normal operation of the sensor, the magnetic field to be sensed is too weak to reverse the magnetizations of the two layers which are blocked in a ferromagnetic configuration. It is cobalt for example.

the second magnetic layer 11, central to the cell, is preferably made of a "soft" magnetic material with a weak saturation field, i.e. with a weak field of reversal. It is iron for example.

The giant magnetoresistance appears when the magnetization of the central layer 11 changes from the antiparallel position (anti-ferromagnetism) to the parallel position (ferromagnetism). The field needed for this permutation is determined by the difference in energy between the two positions which, owing to the frustration of a coupling, is equal to the difference between the energies $E_{af}$ and $E_f$ corresponding respectively to the anti-ferromagnetic and ferromagnetic couplings. The consequence thereof is high magnetoresistance with a very low magnetic field, i.e. the sensor according to the invention is sensitive to weak fields. By opposition, in the known sensors which do not use the coupling frustration, the energy of reversal is equal to the sum of the energies $E_{af}$ and $E_f$, and these sensors are less sensitive.

Figure 6:
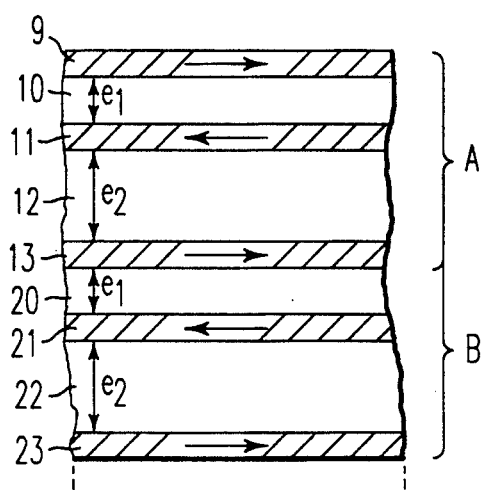

FIG. 5 is devoted to an elementary cell. In fact, a magnetoresistive sensor comprises a large number of similar cells: the examples of 30, 40 or 60 layers are frequently cited, and this is why FIG. 6 represents only a region of a sensor according to the invention, the substrate of which is not shown.

In this more general case of a large number of layers, a sensor is constituted by a stack of cells referenced A, B ... in which the third magnetic layer (13, 23) of a cell constitutes the first magnetic layer of the next cell. The order of stacking of the different layers of non-magnetic materials may be such that thicknesses form a sequence of the $e_1 e_2 e_1 e_2 e_1 \ldots$ type or of the $e_1 e_2 e_2 e_1 e_2 \ldots$ type, but no two layers with thicknesses of $e_1$ should neighbor each other for then the corresponding layer made of "soft" material (11, 21) would not be frustrated. The sensor would thereby lose sensitivity. The variants in the order of the thicknesses $e_1$ and $e_2$ do not entail any change in the order of stacking of the layers of "hard" magnetic materials (9, 13, 23) and "soft" magnetic materials (11, 21).

More generally, a magnetoresistive sensor according to the invention corresponds to a triple alternation: layers of magnetic materials are alternated with layers of non-magnetic materials;

among the magnetic layers, the "hard" type materials with a strong coercive field alternate with "soft" type materials with a weak saturation field, among the non-magnetic layers, the thicknesses vary so that the couplings between magnetic layers are alternately of ferromagnetic and anti-ferromagnetic types.

The magnetoresistance sensor according to the invention is used notably for the reading of magnetic recordings.

What is claimed is:

1. A sensor of magnetic fields with magnetoresistive effect comprising:

a first layer of magnetic material being magnetized in a first predetermined direction;

a second layer of magnetic material being magnetized in a second predetermined direction opposite to the first predetermined direction;

a third layer of magnetic material being magnetized in a first predetermined direction;

wherein the second layer of magnetic material is formed between the first and third layers of magnetic material;

a first layer of non-magnetic material formed between the first and second layers of magnetic material;

a second layer of non-magnetic material formed between the second and third layers of magnetic material; and wherein a thickness of the first layer of non-magnetic material is different than a thickness of the second layer of non-magnetic material, thereby the first and second layers of magnetic material being anti-ferromagnetically coupled together and the second and third layers of magnetic material being ferromagnetically coupled together.

2. The sensor according to claim 1, wherein the first and third layers of magnetic material are formed of hard type magnetic materials and the second layer of magnetic material is formed of soft type magnetic materials.

3. The sensor according to claim 2, wherein the hard type magnetic materials comprise materials selected from the group consisting of Co and Ni, and wherein the soft type magnetic materials comprise materials selected from the group consisting of Fe and NiFe.

4. The sensor according to any of claims 1-3, wherein the first and second layers of non-magnetic material comprise materials selected from the group consisting of Cu, Ag, Au, Mn, Cr, Va and Ti.

* * * * *